AMPLIFIER USING CURRENT CONDUCTION THROUGH WIDE GAP LAYER

Filed June 17, 1968 2 Sheets-Sheet 1

INVENTORS A. GOETZBERGER
E. H. NICOLLIAN
BY H. W. Lockhart
ATTORNEY

United States Patent Office
3,477,033
Patented Nov. 4, 1969

3,477,033
AMPLIFIER USING CURRENT CONDUCTION THROUGH WIDE GAP LAYER

Adolf Goetzberger, Berkeley Heights, and Edward H. Nicollian, Murray Hill, N.J., assignors to Bell Telephone Laboratories, Incorporated, Murray Hill and Berkeley Heights, N.J., a corporation of New York Filed June 17, 1968, Ser. No. 737,432
Int. Cl. H03f 3/68
U.S. Cl. 330—30 3 Claims

ABSTRACT OF THE DISCLOSURE

A signal amplifier comprises an MOS element having a high frequency large signal bias source for achieving appreciable current conduction through the insulating film thereof by injection of hot carriers from the avalanche plasma in the semiconductor layer. A separate much lower frequency signal is amplified by applying it across the MOS element and detecting it across a pair of output terminals in parallel with an RC network whose time constant is long with respect to the period of the high frequency bias signal, and short with respect to the period of the amplified signal.

Figure 1:
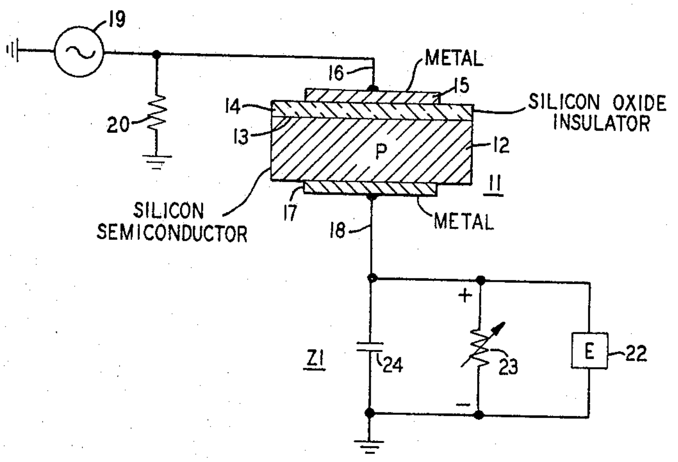

This invention relates to solid state devices in which appreciable and useful conduction is attained in insulating materials. Such conduction in these materials enables a variety of useful devices.

Conduction in insulators is known to occur under certain conditions. Such conduction, however, has not been generally useful. For example, in thermally grown silicon oxide, some conduction can occur if the material is heated to a high temperature, typically several thousand degrees centigrade. It is also known to use incident radiation to excite carriers from an adjoining metal or semiconductor layer into the conduction or valence band of an insulator and thereby enable conduction. Another mechanism for providing conduction in an insulator is by the tunneling phenomena which may occur on a probability basis in accordance with principles of quantum mechanics. However, tunneling occurs only through sufficiently narrow barriers, requiring either very thin insulating layers or very high fields. Both of these requirements inhibit the possible application of tunneling phenomena to useful devices.

However, in accordance with this invention it has been recognized that carriers can be injected in useful quantities into insulating layers of suitable thickness to produce an appreciable unidirectional current on a cyclic basis. In particular, the introduction of conduction carriers into the insulating layer is achieved by overcoming the potential barrier at the semiconductor-insulator interface by creating an avalanche plasma at the interface. High energy (hot) carriers associated with such plasma surmount the barrier and then flow within the insulator as conduction carriers to another contact on the insulator. This conduction provides the basis for an amplifier in accordance with this invention.

More particularly, the formation of an avalanche plasma in the semiconductor requires a relatively high field. Ordinarily, such a field results in the formation, in the metal-oxide-semiconductor structure, of an inversion layer adjoining the semiconductor-insulator interface. The existence of the inversion layer connoting the thermal equilibrium condition precludes the occurrence of avalanche breakdown in the semiconductor portion adjoining the interface.

However, in accordance with this invention there is applied across the semiconductor-insulator structure a large cyclic signal whose period is short compared to the thermal response time of the semiconductor inversion layer and of a magnitude sufficient to produce avalanching. More particularly, the period is such as to preclude thermal equilibrium and the consequent inversion layer. Accordingly, there is produced in the semiconductor portion adjoining the insulator, avalanche plasma which is the source of carriers having sufficient energy to surmount the potential barrier at the semiconductor-insulator interface.

In a particular embodiment in accordance with the invention, the metal-oxide-semiconductor (MOS) element comprises a layer of P type conductivity single crystal silicon, a layer of thermally produced silicon oxide of several thousand Angstroms thickness on one surface of the silicon and an ohmic contact on the opposite surface. A metal film electrode is applied to the silicon oxide film and a high frequency, large signal source is connected thereto to produce avalanche breakdown in the semiconductor portion adjoining the oxide film. There will then be observed a pulsating direct current flowing in the circuit including the metal-oxide-semiconductor element. Further, radiation will be observed originating particularly from the portion of the element in which avalanching is occurring. This conduction within the insulating film provides the basis for amplifying a signal which is of a sufficiently different frequency to inhibit its mixing with the bias signal. Thus, a signal to be amplified may be applied from a separate source across the element and may be detected in amplified form at output terminals across a suitable serially-connected network.

Accordingly, an object of this invention is a device in which appreciable conduction through an insulating material enables novel and useful apparatus.

Figure 2:
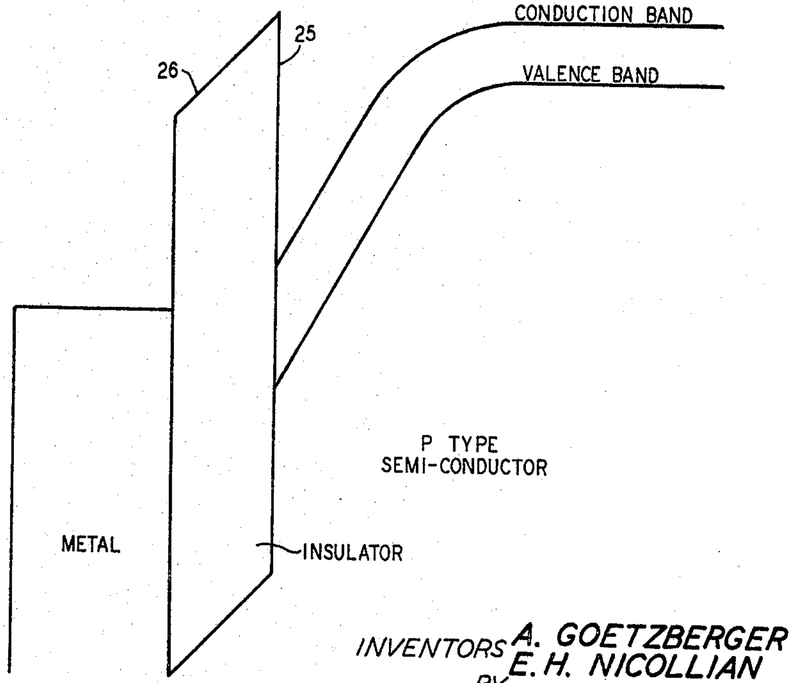
Figure 3:
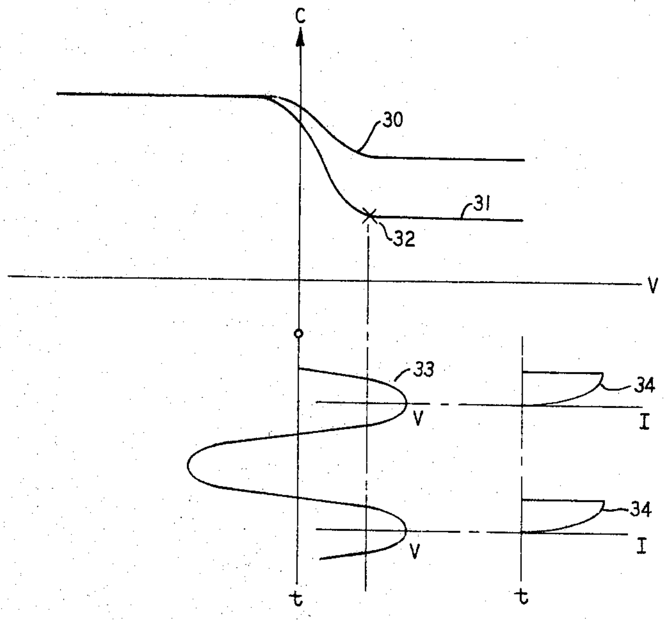
Figure 4:
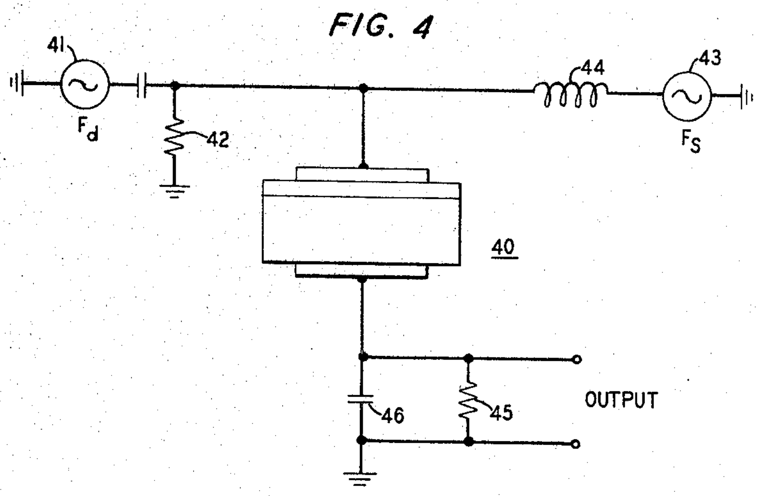

The invention, both as to its other objects and features, as well as with respect to its organization and mode of operation, will be better understood from the following more detailed and specific description, taken in conjunction with the drawing in which:

FIG. 1 shows a schematic circuit arrangement for observing the basic conduction effect in accordance with this invention, and FIG. 2 is an energy level diagram representing the conditions at a semiconductor-insulator interface arising in accordance with this invention, and FIG. 3 is a graph depicting the input and ouput parameters observed in accordance with this invention, and FIG. 4 is an amplifying circuit arrangement in accordance with this invention.

Referring to FIG. 1 a basic embodiment in accordance with this invention includes an MOS element 11, known in the art as a surface varactor. Typically, the element 11 comprises a monocrystalline wafer 12 of P type conductivity silicon about 2 or 3 mils thick and having a resistivity in the range of .06 to 0.4 ohm cm. at least in the portion immediately adjoining the surface 13. On the surface 13 there is a film 14 of silicon oxide having a thickness of about 2000 A. Typically, useful films may range from about 500 to 3000 A. thickness and may be produced conveniently by thermal treatment as is well known in the art.

On the opposite face of the silicon oxide film 14 is a metal film 15 comprising a field electrode and having conductive connection 16 thereto. Another metal film 17 on the opposite face of the semiconductor wafer provides ohmic connection thereto and a further conductive connection 18 is provided to the electrode 17.

Connected to the field electrode 15 by way of the connection 16 is a high frequency, large signal voltage source 19 and a parallel connected input resistance 20. Typically, for operation in the voltage mode, the voltage source provides a signal of about ten megaHertz and a peak value about 20–50 v. In particular, these parameters are sufficiently high to (1) place the element 11 in the deep depletion condition and (2) provide an avalanche plasma in the portion of the semiconductor 12 adjoining the surface 13.

Serially connected to the MOS element 11 by way of conductive lead 18 is a network 21 of parallel-connected elements for observing the current flowing in the apparatus as a consequence of the applied signal. In particular, the network comprises an electrometer 22, a variable resistance 23 and capacitor 24. This network 21 provides means for conveniently observing the cyclic unidirectional current which flows through the MOS element 11 and particularly the insulating layer 14.

The application of a high frequency, very large signal from the source 19 has the effect as illustrated in the energy band diagram of FIG. 2 of bending the conduction and valence band in the semiconductor downward toward the insulator. There are thus provided in the portion of the conduction band adjoining the semiconductor-insulator interface a copious supply of minority carriers, specifically for P type semiconductor material, electrons. By applying a bias signal having a period which is short with respect to the thermal response time of the semiconductor material, thermal equilibrium cannot be reached and the formation of an inversion layer is prevented. By an inversion layer is meant a zone or portion adjoining the semiconductor-insulator interface which, in this instance has N type conduction characteristics.

The condition in which thermal equilibrium is inhibited is known as deep depletion and when accompanied by the application of a sufficiently high reverse voltage enables the occurrence of avalanche breakdown in the portion of the semiconductor 12 adjoining the interface surface 13. It is known that the occurrence of the avalanche conditions accompanied by the generation of very high energy, called "hot," carriers.

In the particular MOS element 11 avalanching may be confirmed by the observation of luminescence during the portions of the cycle when breakdown is occurring. Of more significance is the fact that large numbers of hot carriers surmount the barrier 25 depicted in FIG. 2 and then falling down the potential gradient 26, conduct current as ordinary carriers within the insulating layer 14.

Referring to FIG. 3 the upper portion of the graph shows small signal capacitance-voltage curves 30 and 31 for an MOS varactor using P type silicon. Curve 30 depicts the capacitance value for the direct current bias case. Curve 31 shows the value of capacitance exhibited when a cyclic pulse bias is applied of a short enough width that build-up of an inversion layer is impossible. Point 32 represents the onset of avalanche breakdown. In the lower portion, curves 33 and 34 showing respectively, a signal voltage in the form of a sine wave and corresponding current pulses, both plotted versus time for the capacitance condition represented by curve 31. Thus, during each voltage cycle, as it reaches avalanche, current begins to flow which then is cut off when the voltage starts to decrease. Thus, the output current across the element is unidirectional and is cyclic, that is, in the form of pulses. The magnitude of the current pulse is a function of the magnitude of the signal 33. The output current 34 will increase as the signal swing above avalanche enlarges.

This cyclic unidirectional current or pulse train is conveniently observed on the electrometer 22 which effectively indicates a substantially steady reading as a consequence of the shunting capacitance and resistance elements 24 and 23 respectively whose time constant is large with respect to the period of the applied signal. In such case little or no discharge from capacitor 24 occurs between the current pulses.

Typically, for the configuration already described in connection with FIG. 1 utilizing an MOS element of P type silicon having a resistivity of 0.1 ohm cm., a thermally grown silicon oxide film 600 A. in thickness, application of a signal from source 19 of 25 volts peak and using an input resistor 20 of $10^5$ ohms, a direct current pulse having a peak value of $10^{-6}$ amperes/cm.$^2$ was observed.

One form of apparatus for utilizing current conduction in an insulating layer in accordance with this invention is shown in FIG. 4. This configuration is similar in certain respects to that shown in FIG. 1. However, in addition to a driving source 41 of a high frequency large signal there is provided from the signal source 43 a signal to be amplified. It is important that the driving frequency $F_D$ be much larger than the signal frequency $F_S$. An output network is provided comprising a capacitor 46 and resistor 45 across which the amplified output signal then is observed. In this instance also the time constant of the output network, which is much larger than the period of the driving signal $F_D$, will be much smaller than the period of the signal frequency $F_S$ in order to permit separation of the signals.

Also, the invention has been disclosed in terms of P type semiconductor material which will result in an output having the polarity indicated in FIG. 1, that is negative at the ground terminal and positive at the MOS element. Use of N type semiconductor material is possible with simply a reversal in the polarity on the output current, inasmuch as the injected carriers will then be holes rather than electrons.

Moreover, although the invention has been disclosed in terms of certain specific embodiments it will be recognized that other arrangements may be devised by those skilled in the art which likewise fall within the spirit and scope of the claims.

What is claimed is:

1. An amplifier comprising:

(a) an MOS element, said element comprising a body of semiconductor material entirely of one conductivity type having a layer of dielectric material on one surface of said body and a metal field-inducing plate electrode on the surface of said dielectric layer, (b) a first signal means for applying a first cyclic signal across said element said first signal having a period which inhibits thermal equilibrium and sufficient magnitude to produce avalanche breakdown in the semiconductor portions of the MOS element adjoining the insulating layer, (c) second signal means for applying across said element a second signal to be amplified, (d) output means serially connected with said element including a network and a pair of output terminals across which an amplified form of said second signal is detected, (e) the period of said first signal being much smaller than that of said second signal.

2. An amplifier in accordance with claim 1 in which the network of said ouput means has a time constant intermediate the periods of said first signal and said second signal.

3. An amplifier in accordance with claim 1 in which said first cyclic signal is a sine wave of voltage having a frequency of about ten megaHertz.

References Cited

UNITED STATES PATENTS

| | | | |
|---|---|---|---|
| 2,666,816 | 1/1954 | Hunter | 330—34 |
| 2,964,637 | 12/1960 | Keizer | 329—205 X |

OTHER REFERENCES

Lindner, "Semiconductor Surface Varactor" The Bell System Technical Journal, vol. XLI, No. 3, pp. 803–831, May 1962.

ROY LAKE, Primary Examiner

L. J. DAHL, Assistant Examiner

U.S. Cl. X.R.

330—34